(12) United States Patent
Kim et al.

(10) Patent No.: US 9,064,452 B2
(45) Date of Patent: Jun. 23, 2015

(54) ORGANIC LIGHT EMITTING DIODE DISPLAY

(71) Applicant: Samsung Display Co., Ltd., Yongin-si, Gyeonggi-do (KR)

(72) Inventors: Jae-Bok Kim, Yongin-si (KR); Kwan-Hee Lee, Yongin-si (KR); Won-Jun Song, Yongin-si (KR); Tae-Kyu Shim, Yongin-si (KR); Hye-Lim Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 186 days.

(21) Appl. No.: 13/692,873

(22) Filed: Dec. 3, 2012

(65) Prior Publication Data

US 2013/0241913 A1 Sep. 19, 2013

(30) Foreign Application Priority Data

Mar. 19, 2012 (KR) .......................... 10-2012-0027936

(51) Int. Cl.
*G09G 3/32* (2006.01)
*H01L 27/12* (2006.01)

(52) U.S. Cl.
CPC ............ *G09G 3/3208* (2013.01); *G09G 3/3225* (2013.01); *G09G 2300/08* (2013.01); *G09G 2300/0819* (2013.01); *G09G 2310/0251* (2013.01); *G09G 2310/0262* (2013.01); *G09G 2320/0238* (2013.01); *H01L 27/1255* (2013.01)

(58) Field of Classification Search
CPC combination set(s) only.
See application file for complete search history.

(56) References Cited

U.S. PATENT DOCUMENTS

| 6,084,579 | A  | * | 7/2000  | Hirano ......................... 345/205 |
| 2004/0263508 | A1 | * | 12/2004 | Koyama et al. ............... 345/212 |
| 2008/0150846 | A1 | * | 6/2008  | Chung ............................ 345/80 |
| 2009/0129724 | A1 | * | 5/2009  | Carter et al. .................... 385/14 |
| 2011/0025212 | A1 | * | 2/2011  | Kolosov et al. ........... 315/185 R |

FOREIGN PATENT DOCUMENTS

| JP | 2003-303687 | 10/2003 |
| JP | 2010-3810 A | 1/2010 |
| KR | 10-2008-0020221 | 3/2008 |
| KR | 10-2008-0054050 | 6/2008 |
| KR | 10-2009-0131302 | 12/2009 |
| KR | 10-2010-0133725 | 12/2010 |

\* cited by examiner

*Primary Examiner* — Claire X Pappas
*Assistant Examiner* — Benjamin Casarez
(74) *Attorney, Agent, or Firm* — Christie, Parker & Hale LLP (57) ABSTRACT

An organic light emitting diode (OLED) display according to an exemplary embodiment of the present invention includes: a switching transistor configured to perform a switching operation according to a scan signal; a driving transistor configured to supply a driving current according to a data signal transmitted according to the switching operation of the switching transistor; an organic light emitting element electrically connected with the driving transistor and configured to emit light according to the driving current; a resistor having a first end connected with an anode of the organic light emitting element; and a bypass wire connected with a second end of the resistor.

10 Claims, 10 Drawing Sheets

ORGANIC LIGHT EMITTING DIODE DISPLAY

CROSS-REFERENCE TO RELATED APPLICATION

This application claims priority to and the benefit of Korean Patent Application No. 10-2012-0027936 filed in the Korean Intellectual Property Office on Mar. 19, 2012, the entire contents of which are incorporated herein by reference.

BACKGROUND (a) Field

Embodiments of the present invention relate to an organic light emitting diode (OLED) display. More particularly, embodiments of the present invention relate to an OLED display having stabilized luminescence characteristics.

(b) Description of the Related Art

Unlike the liquid crystal display (LCD), an organic light emitting diode (OLED) display does not use a separate light source, thereby making it possible to be implemented as a slim and lightweight display. Furthermore, as the organic light emitting diode display has high quality characteristics such as lower power consumption, high luminance, and fast response time, it has been considered as a next generation display device.

The OLED includes a plurality of light emitting diodes each having a hole injection electrode, an organic emission layer, and an electron injection electrode. Electrons and holes are combined with each other in an organic emissive layer to thereby generate excitons. When the excitons shift from the excited state to the ground state, energy is generated so as to emit light, and images are displayed using the emitted light. In this case, the organic light emitting element (e.g., an organic light emitting diode) receives a driving current from a driving thin film transistor.

However, the organic light emitting element may emit light caused by a leakage current while the driving thin film transistor is in the turn-off state. That is, the organic light emitting element emits light in a black mode caused by the leakage current so that a contrast ratio of the OLED display may be deteriorated.

In addition, undesirable light emission of the organic light emitting element due to the leakage current may reduce the life-span of the organic light emitting element.

The above information disclosed in this Background section is only for enhancement of understanding of the background of the invention, and therefore it may contain information that does not form the prior art that is already known in this country to a person of ordinary skill in the art.

SUMMARY

Embodiments of the present invention have been made in an effort to provide an organic light emitting diode display having improved luminance characteristics.

An organic light emitting diode (OLED) display according to an exemplary embodiment of the present invention includes: a switching transistor configured to perform a switching operation according to a scan signal; a driving transistor configured to supply a driving current according to a data signal transmitted according to the switching operation of the switching transistor; an organic light emitting element electrically connected with the driving transistor and configured to emit light according to the driving current; a resistor having a first end connected with an anode of the organic light emitting element; and a bypass wire connected with a second end of the resistor.

The resistor may be formed in the same layer where a semiconductor layer of at least one of the switching transistor or the driving transistor is formed.

The OLED display may further include a connection member connecting the anode of the organic light emitting element and the first end of the resistor.

The connection member may be formed in the same layer where a source electrode and a drain electrode of at least one of the switching transistor or the driving transistor are formed.

The bypass wire may include an initializing voltage wire configured to initialize the driving transistor.

The initializing voltage wire may be formed in the same layer where a gate electrode of at least one of the switching transistor or the driving transistor is formed.

The OLED display may further include a first power wire connected with the source electrode of the driving transistor and a second power wire connected with a second electrode of the organic light emitting element. In addition, the bypass wire may be electrically connected with the second power wire.

The bypass wire may be formed on the same layer where a gate electrode of at least one of the switching transistor or the driving transistor is formed.

The OLED display may further include a scan wire configured to supply the scan signal, and the bypass wire and the scan wire may be formed substantially in parallel with each other in the same layer. The organic light emitting element may include an organic emission layer on the anode and a cathode on the organic emission layer, and the bypass wire may be connected with the cathode.

The resistor may be formed in the same layer where a source electrode and a drain electrode of at least one of the switching transistor or the driving transistor is formed.

The first end of the resistor may be directly connected with the anode.

The organic emission layer may include a main emission layer corresponding to the anode and configured to emit light, a hole traveling layer between the main emission layer and the anode, and corresponding to the cathode, and an electron traveling layer between the main emission layer and the cathode, and corresponding to the cathode, and the bypass wire may include a sub-wire directly connected with the second end of the resistor and formed in the same layer of the anode, a hole traveling layer directly connected with the sub-wire corresponding to the sub-wire, and the electron traveling layer corresponding to the sub-wire.

The resistor may be layered on the anode.

The first end of the resistor may be directly connected with the anode.

The organic emission layer may include a main emission layer corresponding to the anode and configured to emit light, a hole traveling layer between the main emission layer and the anode, and corresponding to the cathode, and an electron traveling layer between the main emission layer and the cathode, and corresponding to the cathode, and the bypass wire may include the hole traveling layer directly connected with the resistor corresponding to the resistor and the electron traveling layer corresponding to the resistor.

According to the exemplary embodiments of the present invention, luminance characteristics of the OLED display can be improved.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, in various exemplary embodiments, the same reference numerals are used in respect to the constituent elements having the same constitution and illustrated in the first exemplary embodiment, and in the second, third, and fourth exemplary embodiments, only constitution that is different from the first exemplary embodiment is illustrated.

It shall be noted that the drawings are schematic and do not depict exact dimensions. The relative proportions and ratios of elements in the drawings may be exaggerated or diminished in size for the sake of clarity and convenience in the drawings, and such arbitrary proportions are only illustrative and not limiting in any way. Like reference numerals are used for like structures, elements, or parts shown in two or more drawings to show similar characteristics. When one part is said to be "over" or "on" another part, the one part may be directly over the other part or may be accompanied by another part interposed therebetween.

Exemplary embodiments of the present invention are specifically shown. As a result, various modifications of the drawings are anticipated. Accordingly, exemplary embodiments are not limited to certain forms of the regions illustrated, but may include forms that are modified through manufacturing, for example.

Hereinafter, an organic light emitting diode (OLED) display 101 according to a first exemplary embodiment of the present invention will be described with reference to FIG. 1 to FIG. 3.

Figure 1:
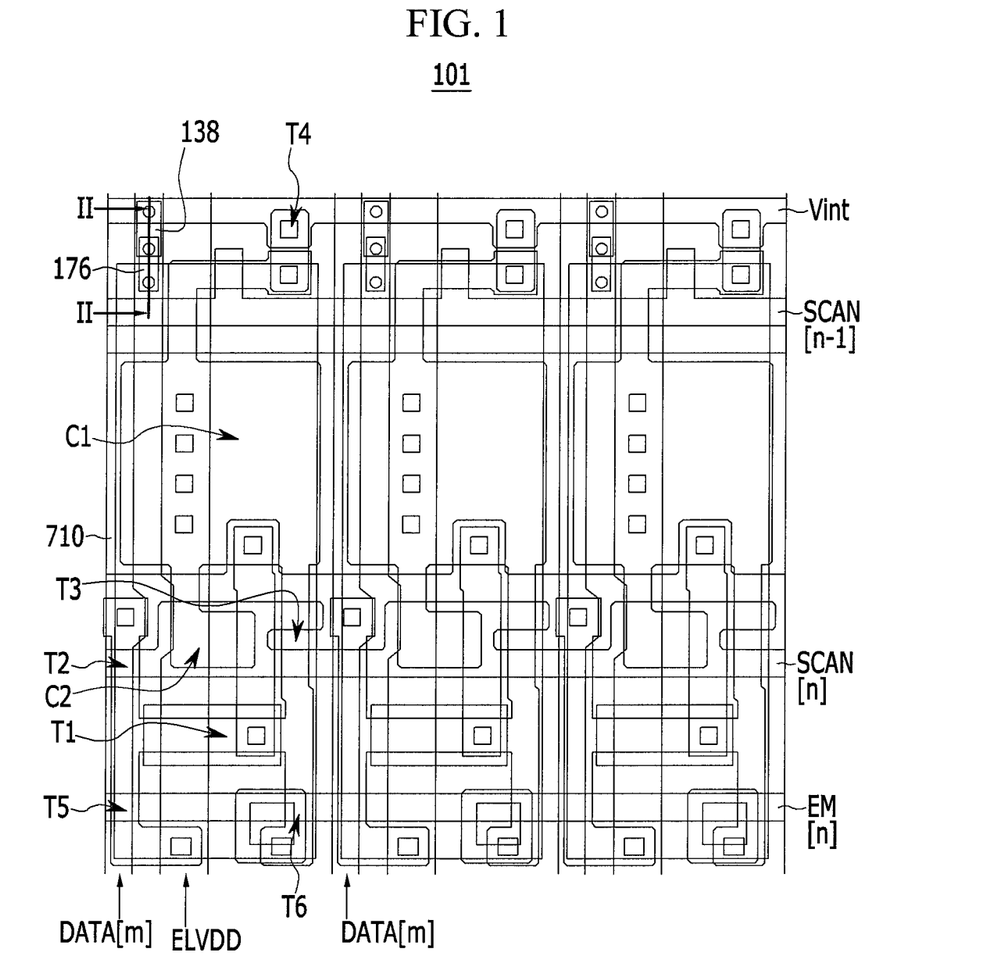
FIG. 1 is a pixel layout view of an organic light emitting diode display according to a first exemplary embodiment of the present invention.

FIG. 1 is a layout view of pixels of the OLED display 101 according to the first exemplary embodiment of the present invention. Herein, a single pixel is the minimum unit of the OLED display 101 for displaying an image. FIG. 1 illustrates three pixels. FIG. 2 is a cross-sectional view of FIG. 1, taken along the line II-II. FIG. 3 is a schematic circuit diagram of the pixel of FIG. 1.

Figure 2:
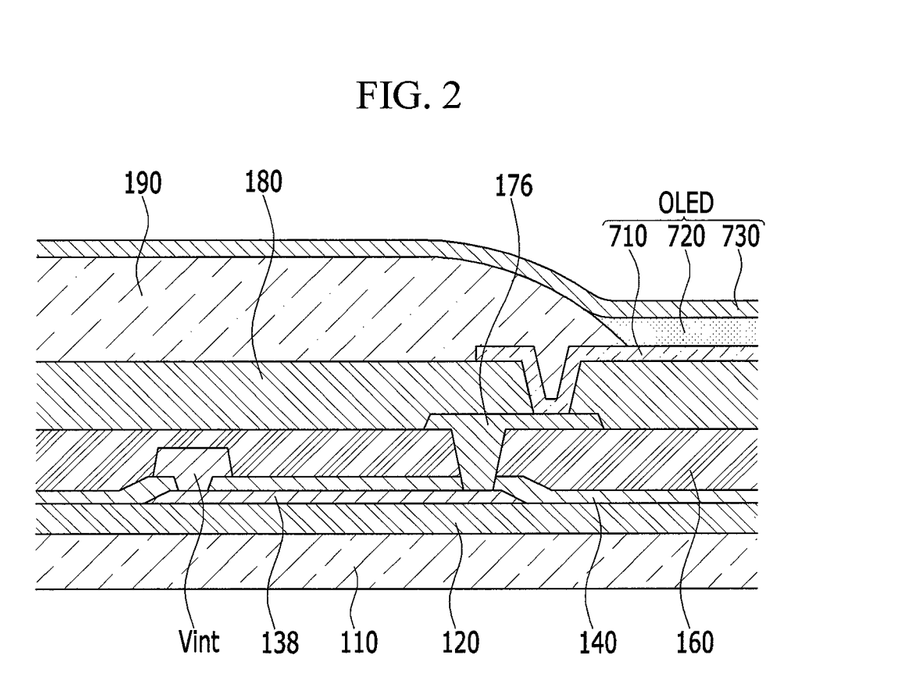
FIG. 2 is a cross-sectional view of FIG. 1, taken along the line II-II.

As shown in FIG. 1 and FIG. 2, the OLED display 101 according to the first exemplary embodiment of the present invention includes a driving thin film transistor T1, a switching thin film transistor T2, at least one of capacitors C1 and C2, a scan wire SCAN[n], a data wire DATA[m], a first power wire ELVDD, a second power wire ELVSS (not shown FIG. 1), and an organic light emitting element OLED; and they are formed in each pixel.

In addition, the OLED display 101 may further include a scan wire SCAN[n−1], a light emission control line EM[n], an initializing voltage wire Vint, and thin film transistors T3, T4, T5, and T6. Here, the thin film transistor T3 is a compensation thin film transistor T3.

An initializing voltage VIN transmitted through the initializing voltage wire Vint may initialize the driving thin film transistor T1.

Further, the OLED display 101 according to the first exemplary embodiment of the present invention includes a resistor 138 of which a first end is connected to an anode 710 of the organic light emitting element OLED. A second end of the resistor 138 is connected with a bypass wire. In addition, in the first exemplary embodiment, the bypass wire may be an initializing voltage wire Vint.

The switching thin film transistor T2 performs switching operation according to a scan signal transmitted through the scan wire SCAN[n]. That is, a gate electrode of the switching thin film transistor T2 is connected with the scan wire SCAN [n]. A source electrode of the switching thin film transistor T2 is connected with the data wire DATA[m]. The scan wire SCAN[n] and the data wire DATA[m] may be respectively formed in directions crossing each other. A drain electrode of the switching thin film transistor T2 is electrically connected with a source electrode of the driving thin film transistor T1 and the first power wire ELVDD.

The driving thin film transistor T1 receives a data signal according to the switching operation of the switching thin film transistor T2 and supplies a driving current to the organic light emitting element OLED.

A gate electrode of the driving thin film transistor T1 is connected with a first electrode of the first capacitor C1. In addition, a second electrode of the first capacitor C1 is connected with the first power wire ELVDD.

The first power wire ELVDD is formed in parallel with the data wire DATA[m]. A drain electrode of the driving thin film transistor T1 is electrically connected with the anode 710 of the organic light emitting element OLED. In addition, a cathode 730 of the organic light emitting element OLED is connected with the second power wire ELVSS. Accordingly, the organic light emitting element OLED receives the driving current from the driving thin film transistor T1 and thus emits light.

The organic light emitting element OLED includes the anode 710 for injecting holes, the cathode 730 for injecting electrons, and an organic emission layer 720 located between the anode 710 and the cathode 730. Electrons and holes are combined with each other in an organic emissive layer to thereby generate excitons. When the excitons shift from the excited state to the ground state, energy is generated so as to emit light, and images are displayed using the emitted light.

In the first exemplary embodiment of the present invention, the first end of the resistor 138 is connected with the anode 710 of the organic light emitting element OLED, and the second end of the resistor 138 is connected with the initializing voltage wire Vint, which is the bypass wire.

The resistor 138 is formed in the same layer where a semiconductor layer of at least one of the switching thin film transistor T2 and the driving thin film transistor T1 is formed. In addition, the resistor 138 may be formed of a material (e.g., a semiconductor material) that is the same as a material of the semiconductor layer of the at least one of the switching thin film transistor T2 and the driving thin film transistor T1. In this case, one or more of the switching thin film transistor T2 and the driving thin film transistor T1 has a top gate structure, and the semiconductor layer is disposed lower than the gate electrode, the source electrode, and the drain electrode.

In addition, the OLED display 101 may further include a connection member 176 that connects the first end of the resistor 138 and the anode 710 of the organic light emitting element OLED. The connection member 176 is formed in the same layer where a source electrode and a drain electrode of at least one of the switching thin film transistor T2 and the driving thin film transistor T1 are formed. In addition, the connection member 176 may be formed of the same material as a material of the source electrode and the drain electrode of the least one of the switching thin film transistor T2 and the driving thin film transistor T1.

As shown in FIG. 2, a plurality of insulation layers 140, 160, and 180 are formed between the resistor 138 and the anode 710 of the organic light emitting element OLED, and the thickness of the plurality of insulation layers 140, 160, and 180 may be relatively large. When the first end of the resistor 138 and the anode 710 of the organic light emitting element OLED cannot directly contact each other, the first end of the resistor 138 and the anode 710 of the organic light emitting element OLED are electrically connected through the connection member 176.

In addition, the initializing voltage wire Vint, which is the bypass wire connected with the second end of the resistor 138, is formed in the same layer where a gate electrode of at least one of the switching thin film transistor T2 and the driving thin film transistor T1 is formed, and may be formed of the same material of the gate electrode. Thus, the initializing voltage wire Vint may be formed in parallel with the scan wire SCAN[n].

In addition, the OLED display 101 further includes a buffer layer 120 disposed under at least one of the resistor 138 formed of a semiconductor material, the switching thin film transistor T2, and driving thin film transistor T1, and a substrate 110 where the buffer layer 120 is formed. The OLED display 101 may further include a pixel defining layer 190 having an opening that defines a light emission area of the organic light emitting element OLED.

In the OLED display 101 of the first exemplary embodiment of the present invention, the driving current passed through the driving thin film transistor T1 is divided into the resistor 138 and the organic light emitting element OLED. The resistance of the organic light emitting element OLED varies according to emission luminance, and decreases as the luminance is increased.

Thus, the current flowing to the resistor 138 changes according to the emission luminance of the organic light emitting element OLED.

In further detail, a part of the leakage current flowing in the driving thin film transistor T1 flows to the initializing voltage wire Vint through the resistor 138 while the driving thin film transistor T1 is in the turn-off state.

Thus, a deterioration degree of a contrast ratio of the OLED display 101 due to light emission of the organic light emitting element OLED in a black mode by the leakage current can be decreased.

Hereinafter, operation of the OLED display according to the first exemplary embodiment of the present invention will be described in further detail with reference to FIG. 3.

First, while the thin film transistor T4 is in the turn-on state according to the scan signal transmitted through the scan wire SCAN[n−1], the initializing voltage VIN is supplied to the first end of the capacitor C1 and the gate electrode of the driving thin film transistor T1.

Next, the switching thin film transistor T2 and the compensation thin film transistor T3 are turned on according to the scan signal transmitted through the scan wire SCAN[n]. While the switching thin film transistor T2 and the compensation thin film transistor T3 are in the turn-on state, the data voltage transmitted through the data wire DATA[m] is transmitted to the source electrode of the driving thin film transistor T1, and the driving thin film transistor T1 is diode-connected.

Then, a voltage obtained by subtracting a threshold voltage of the driving thin film transistor T1 from the data voltage is applied to the gate electrode and the source electrode of the driving thin film transistor T1.

Next, the thin film transistors T5 and T6 are turned on by a light emission control signal transmitted through the light emission control line EM[n], and a voltage of the gate electrode of the driving thin film transistor T1 is boosted by an increase of the scan signal transmitted through the scan wire SCAN[n].

While the two thin film transistors T5 and T6 are in the turn-on state, a voltage of the first power wire ELVDD is supplied to the source electrode of the driving thin film transistor T1, and a driving current according to a gate-source voltage difference flows to the driving thin film transistor T1. The driving current is transmitted to the anode of the organic light emitting element OLED through the turned-on thin film transistor T6.

When the driving thin film transistor T1 is operated according to a data voltage of high luminance, the organic light emitting element OLED has low resistance. The resistance of the resistor 138 may be set to be larger than the resistance of the organic light emitting element OLED. Accordingly, most of the driving current flows to the organic light emitting element OLED.

When the driving thin film transistor T1 is operated according to a data voltage of low luminance, the resistance of the organic light emitting element OLED is significantly higher compared to that of high luminance. Thus, a portion of the driving current flowing to the resistor 138 is increased compared to the case of high luminance.

That is, more driving current flows to the resistor 138 in a luminance region where the resistance of the resistor 138 is lower than that of the resistance of the organic light emitting diode OLED, and more driving current flows to the organic light emitting diode OLED in a luminance region where the resistance of the resistor 138 is higher than that of the organic light emitting diode OLED.

The resistance of the resistor 138 may be set to a proper value within a range from a resistance value of the organic light emitting diode OLED in the lowest luminance to a resistance value of the organic light emitting diode OLED in the highest luminance.

When the resistor 138 is connected to the organic light emitting element OLED, more current flows than a case when no resistor 138 is used. The increased degree of the driving current is relatively larger in the low luminance region. Then, a ratio of a current dispersion with respect to a target luminance in a low luminance area can be decreased. In further detail, since the organic light emitting element (OLED) emits light of luminance with a small driving current, when a variation occurs between driving currents due to characteristic differences of the driving thin film transistors, substantial luminance variation may be recognized. However, when a resistor is used, the driving current for light emission of the organic light emitting element (OLED) with the corresponding low luminance is increased so that a ratio between the driving current variation and the driving current is decreased.

For high luminance, an increase of the driving current by the resistor is relatively small, and the resistance of the organic light emitting element is low so that the influence of the current flowing to the resistor during light emission may be insignificant.

Accordingly, for the same luminance of the case when no resistor is provided, the amount of current flowing to the driving thin film transistor is increased to reduce the ratio of current dispersion with respect to the target current, and mura may be increased.

Hereinafter, an OLED display 102 according to a second exemplary embodiment of the present invention will be described with reference to FIG. 4 to FIG. 6.

Figure 4:
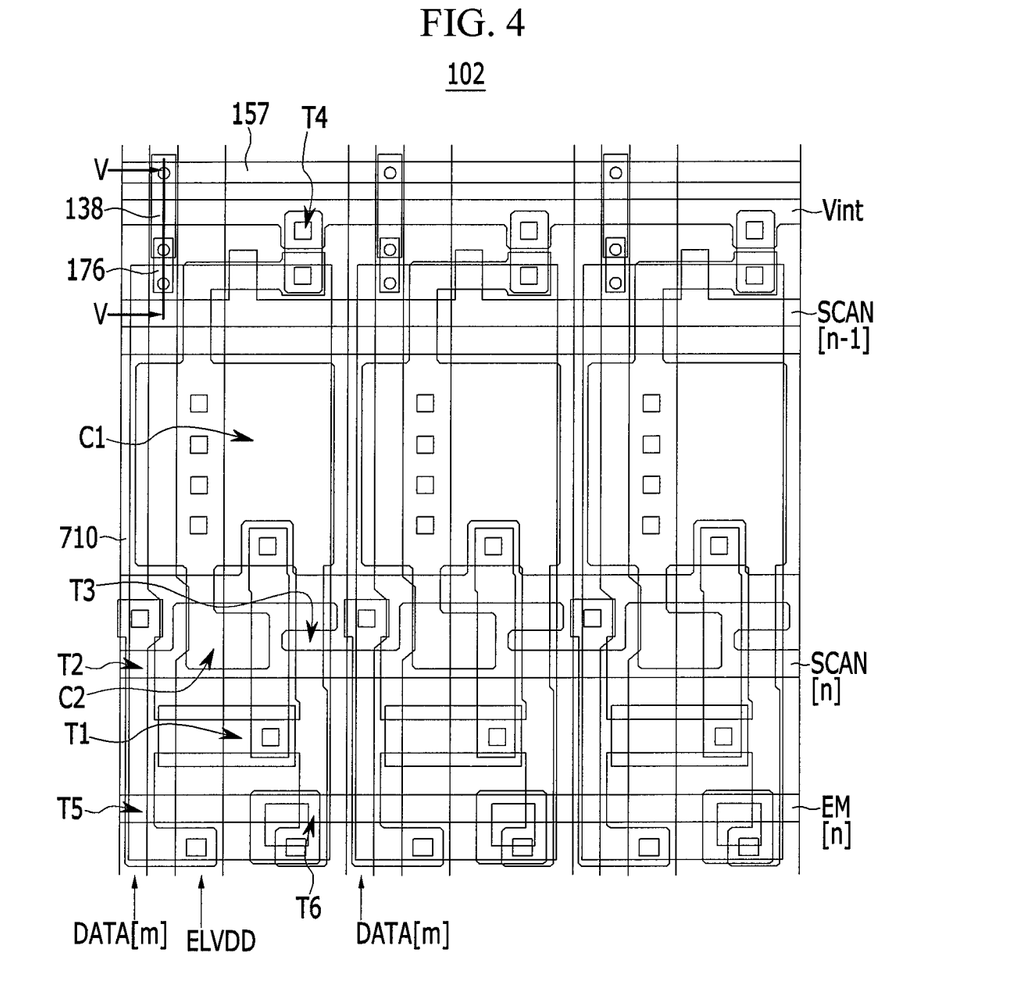
FIG. 4 is a pixel layout view of an organic light emitting diode display according to a second exemplary embodiment of the present invention.
Figure 5:
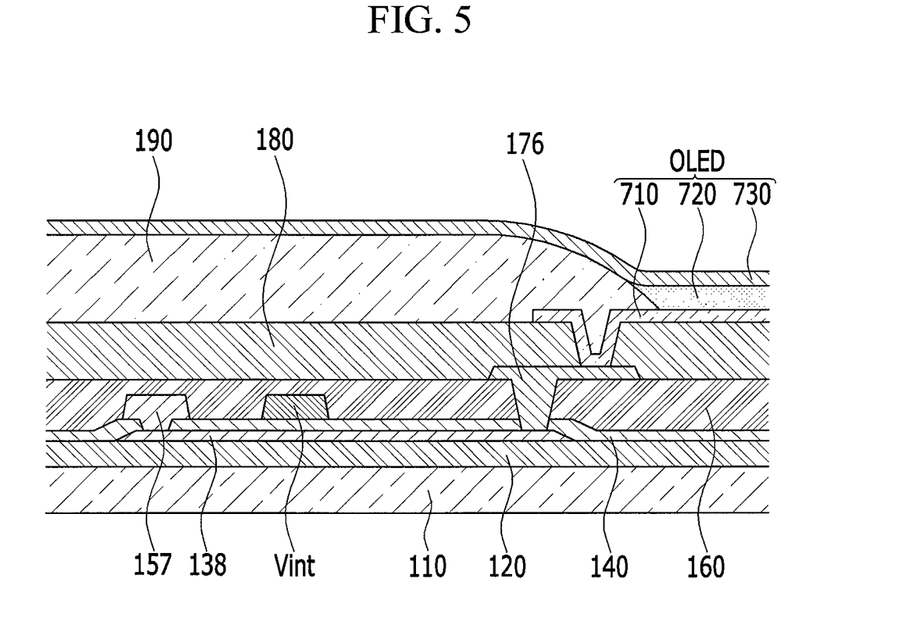
FIG. 5 is a cross-sectional view of FIG. 4, taken along the line V-V.

As shown in FIG. 4 and FIG. 5, the OLED display 102 according to the second exemplary embodiment of the present invention includes a bypass wire 157, and the bypass wire 157 is an additional wire rather than an initializing voltage wire.

In the second exemplary embodiment of the present invention, the bypass wire 157 is electrically connected with a second power wire ELVSS. That is, the bypass wire 157 may be regarded as an auxiliary second power wire.

The bypass wire 157 is formed in the same layer where a gate electrode of at least one of a switching thin film transistor T2 and a driving thin film transistor T1 is formed, and may be formed of the same material of the gate electrode. In addition, the bypass wire 157 may be formed in parallel with a scan wire SCAN[n] in the same layer.

With such a configuration, the OLED display 102 according to the second exemplary embodiment of the present invention can have an improved luminance characteristic.

In further detail, while the driving thin film transistor T1 is in the turn-off state, a part of the leakage current generated from the driving thin film transistor T1 flows to the second power wire ELVSS through a resistor 138 and the bypass wire 157.

Thus, a deterioration degree of a contrast ratio of the OLED display 102 due to light emission of the organic light emitting diode OLED in a black mode by the leakage current can be decreased.

In addition, shortening of life-span of the organic light emitting diode OLED due to emission of the organic light emitting diode OLED by the leakage current can be prevented.

Figure 6:
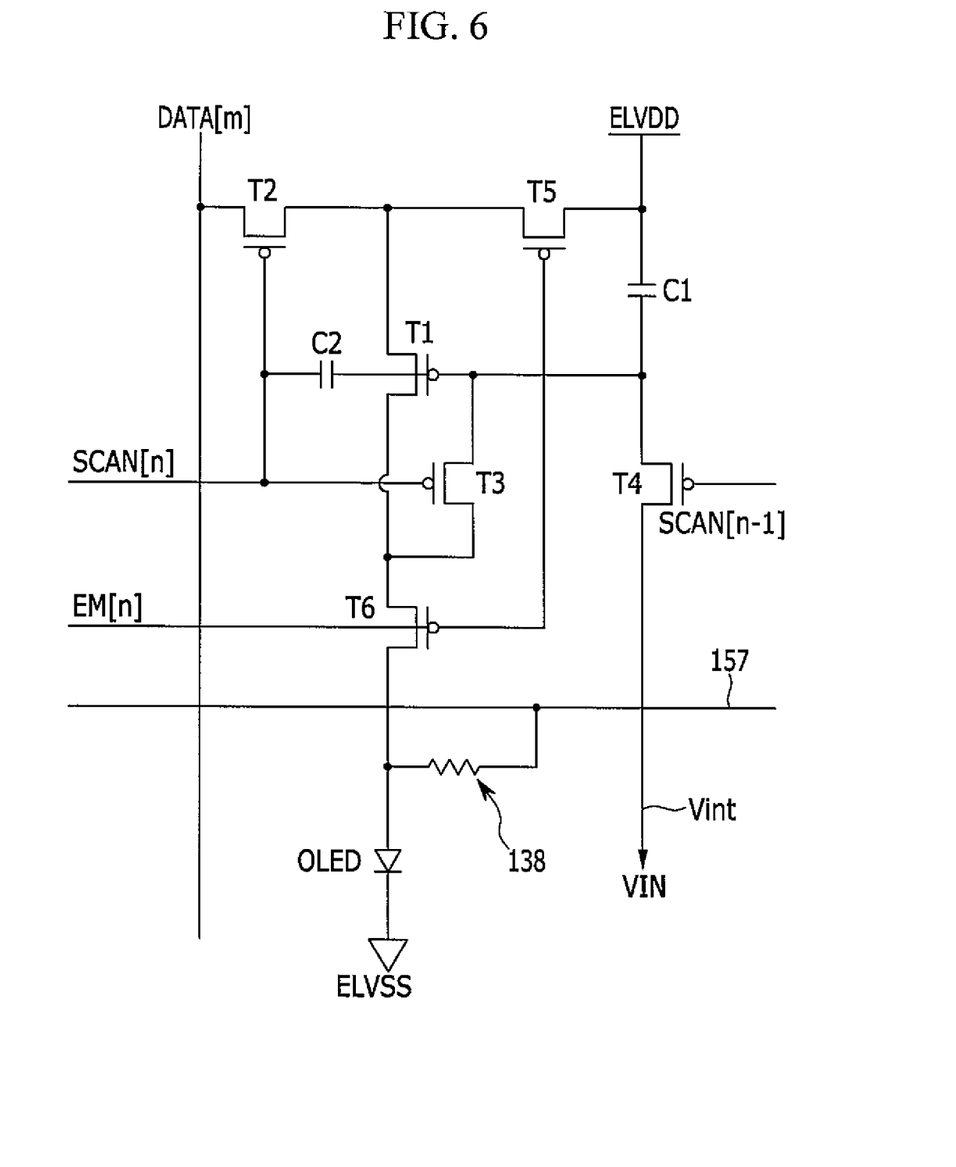
FIG. 6 is a schematic circuit diagram of a pixel of FIG. 4.

FIG. 6 shows a pixel of the OLED display 102 according to the second exemplary embodiment of the present invention.

Figure 3:
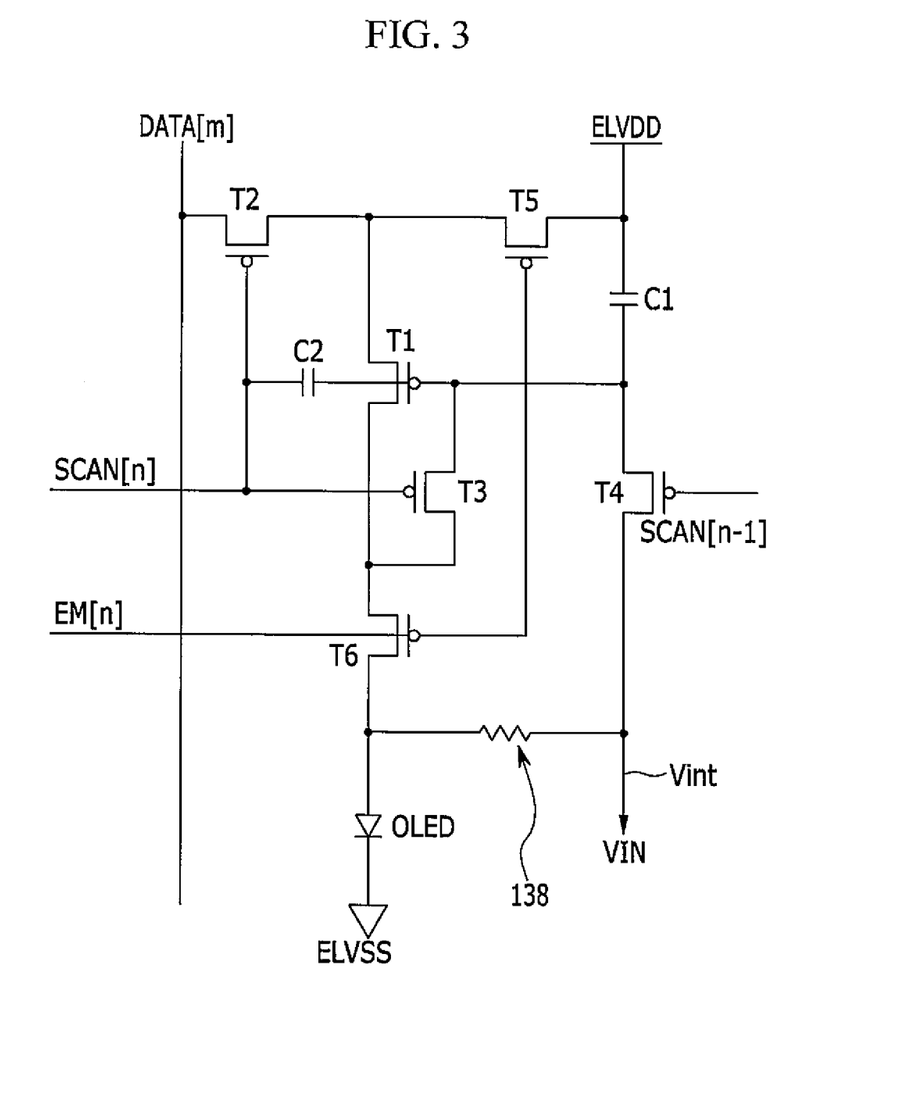
FIG. 3 is a schematic circuit diagram of a pixel of FIG. 1.

The pixel shown in FIG. 6 is substantially the same as the pixel shown in FIG. 3, except that the resistor 138 is connected between an anode of an organic light emitting element OLED and the bypass wire 157.

Operation of the pixel of FIG. 6 is also substantially the same as the first exemplary embodiment shown in FIG. 3

However, a portion of a driving current flowing to the resistor 138 flows through the bypass wire 157.

Hereinafter, an OLED display according to a third exemplary embodiment of the present invention will be described with reference to FIG. 7 and FIG. 8.

Figure 7:
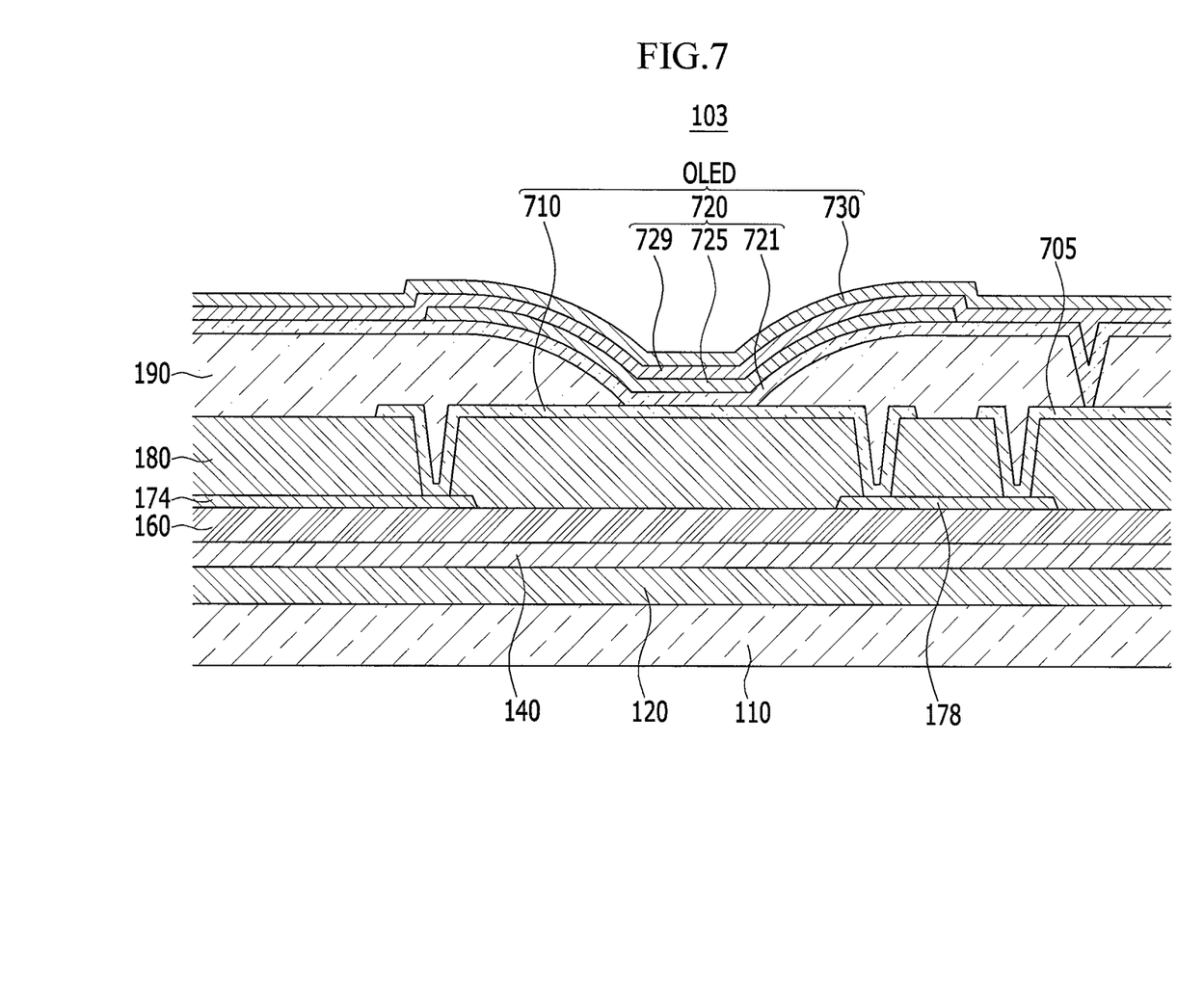
FIG. 7 is a cross-sectional view of an organic light emitting diode display according to a third exemplary embodiment of the present invention.

FIG. 7 is a cross-sectional view of an OLED display according to the third exemplary embodiment of the present invention. FIG. 8 is a schematic circuit diagram of a pixel of the OLED display according to the third exemplary embodiment of the present invention.

Figure 8:
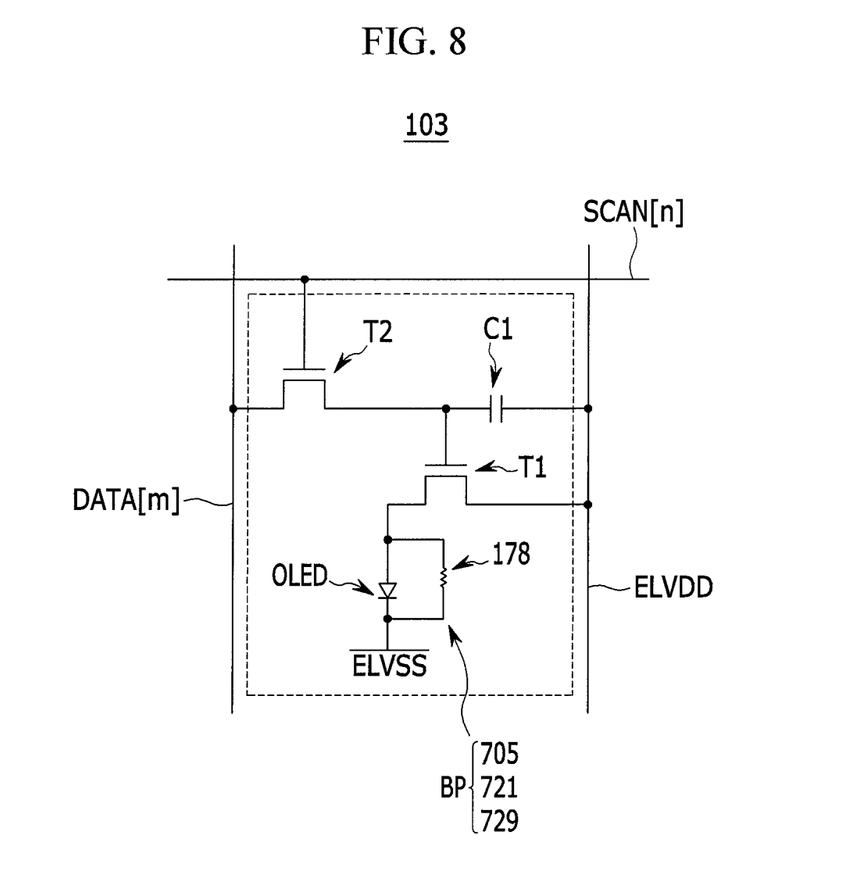
FIG. 8 is a schematic circuit diagram of a pixel of an organic light emitting diode display according to the third exemplary embodiment of the present invention.

As shown in FIG. 7 and FIG. 8, an OLED display 103 according to the third exemplary embodiment of the present invention includes a driving thin film transistor T1, a switching thin film transistor T2, a capacitor C1, a scan wire SCAN [n], a data wire DATA[m], a first power wire ELVDD, a second power wire ELVSS, and an organic light emitting element OLED; and they are formed in each pixel.

In addition, the OLED display 103 according to the third exemplary embodiment of the present invention includes a resistor 178 connected to a first end of an anode 710. A second end of the resistor 178 is connected with a bypass wire BP. In addition, in the third exemplary embodiment, the bypass wire BP includes a sub-wire 705, a hole traveling layer 721, and an electron traveling layer 729, and is connected with a cathode 730. That is, a first end of the resistor 178 is connected with the anode 710 and a second end thereof is connected with the cathode 730.

The organic light emitting element OLED includes the anode 710 for injecting holes, the cathode 730 for injecting electrons and extended throughout the organic light emitting element OLED, and an organic emission layer 720 disposed between the anode 710 and the cathode 730. The organic emission layer 720 includes a hole traveling layer 721, a main emission layer 725, and an electron traveling layer 729. The hole traveling layer 721 includes a hole injection layer (HIL) and a hole transport layer (HTL), and is a channel through which the holes injected from the anode 710 travel. The electron traveling layer 729 includes an electron injection layer (EIL) and an electron transport layer (ETL), and is a channel through which the electrons injected from the cathode 730 travel. The holes and electrodes respectively injected from the anode 710 and the cathode 730 are combined in the main emission layer 725 such that light emission is carried out in the main emission layer 725. The main emission layer 725 is disposed in a portion only corresponding to the anode 710, and the hole traveling layer 721 and the electron traveling layer 729 are extended throughout the organic light emission layer 720 corresponding to the cathode 730.

In the third exemplary embodiment of the present invention, the first end of the resistor 178 is directly connected with the anode 710 of the organic light emitting element OLED, and the second end of the resistor 178 is connected to the sub-wire 705, which is the bypass wire BP, the hole traveling layer 721, and the electron traveling layer 729.

The resistor 178 is formed in the same layer of a source electrode and a drain electrode 174 of at least one of the switching thin film transistor T2 and the driving thin film transistor T1. In addition, the resistor 178 may be formed of the same material of the source electrode and the drain electrode 174 of the at least one of the switching thin film transistor T2 and the driving thin film transistor T1.

The sub-wire 705 of the bypass wire BP is directly connected with the second end of the resistor 178 and thus formed in the same layer of the anode 710, and may be formed of the same material of the anode 710. The hole traveling layer 721 and the electron traveling layer 729 of the bypass wire BP are directly connected with the sub-wire 705 through different openings formed in a pixel defining layer 190 to expose the sub-wire 705, and the hole traveling layer 721 is directly connected with the sub-wire 705.

In the OLED display 103 according to the third exemplary embodiment of the present invention, the driving current passed through the driving thin film transistor T1 is divided into the resistor 178 and the organic light emitting element OLED. The resistance of the organic light emitting element OLED varies according to emission luminance, and the resistance becomes low as the luminance is high.

Thus, the current flowing to the resistor 178 is changed according to the emission luminance of the organic light emitting element OLED.

In further detail, while the driving thin film transistor T1 is in the turn-off state, a leakage current flowing in the thin film transistor T1 partially flows to the cathode 730 through the resistor 178 and the bypass wire BP.

Thus, a deterioration degree of a contrast ratio of the OLED display 103 due to light emission of the organic light emitting element OLED in a black mode by the leakage current can be decreased.

Hereinafter, operation of the OLED display according to the third exemplary embodiment of the present invention will be described in further detail with reference to FIG. 8.

First, the switching thin film transistor T2 is turned on according to a scan signal transmitted through the scan wire SCAN[n]. While the switching thin film transistor T2 is in the turn-on state, a data voltage transmitted through a data wire DATA[m] is transmitted to a gate electrode of the driving thin film transistor T1, a voltage of a first power wire ELVDD is supplied to a source electrode of the driving thin film transistor T1, and a driving current according to a gate-source voltage difference flows to the driving thin film transistor T1. The driving current is transmitted to an anode of the organic light emitting element OLED.

When the driving thin film transistor T1 is operated according to a data voltage of low luminance, the resistance of the organic light emitting element OLED is significantly high compared to that of high luminance. Thus, a portion of the driving current flowing to the resistor 178 is increased compared to that of the high luminance.

That is, in a luminance area where the resistance of the organic light emitting element OLED is higher than the resistance of the resistor 178, more driving current flows to the resistor 178.

When the resistor 178 is connected to the organic light emitting element OLED, more current should flow than a case when no resistor 178 is used. The increased degree of the driving current is relatively larger in the low luminance region. Then, a ratio of a current dispersion with respect to a target luminance in a low luminance area can be decreased. In further detail, since the organic light emitting element OLED emits light of luminance with a small driving current, when a variation occurs between driving currents due to characteristic differences of the driving thin film transistors, substantial luminance variation may be recognized. However, when a resistor is used, the driving current for light emission of the organic light emitting diode (OLED) with the corresponding low luminance is increased so that a ratio between the driving current variation and the driving current is decreased.

Accordingly, for the same luminance of the case when no resistor is provided, the amount of current flowing to the driving thin film transistor is increased to reduce the ratio of current dispersion with respect to the target current, and mura can be increased.

Hereinafter, an OLED display according to a fourth exemplary embodiment of the present invention will be described with reference to FIG. 9 and FIG. 10.

Figure 9:
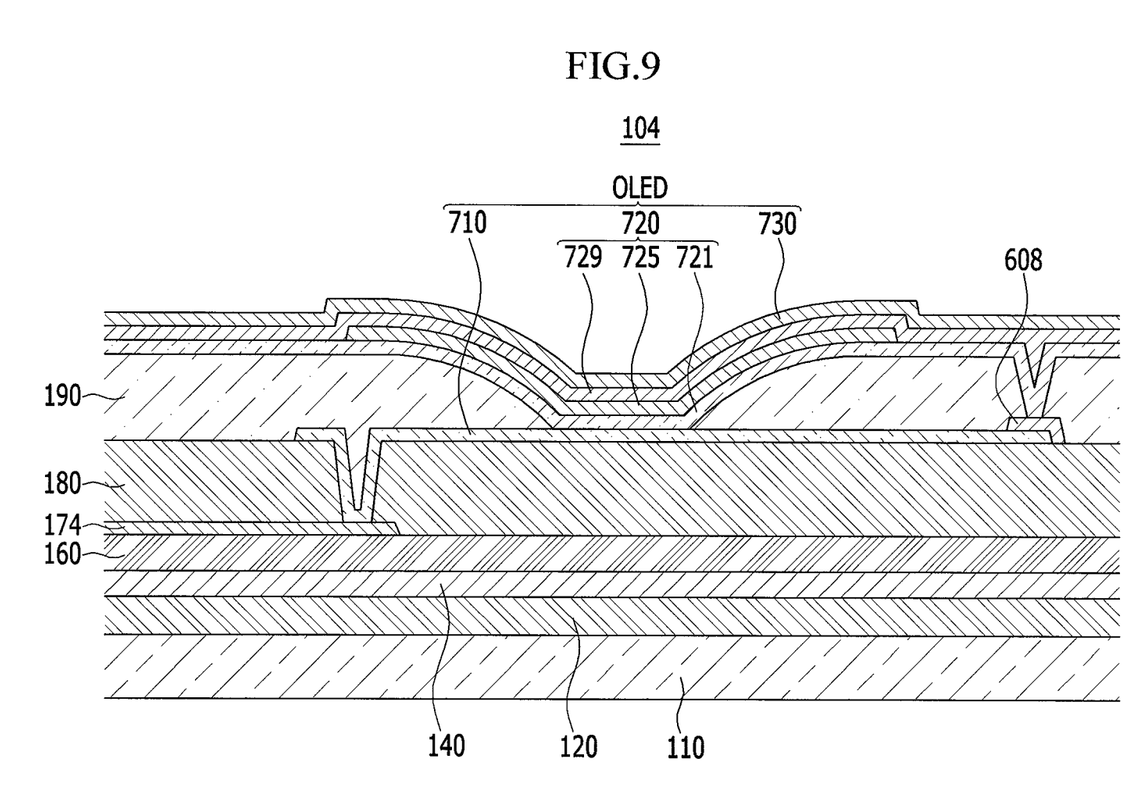
FIG. 9 is a cross-sectional view of an organic light emitting diode display according to a fourth exemplary embodiment of the present invention.

FIG. 9 is a cross-sectional view of an OLED display according to the fourth exemplary embodiment of the present invention. FIG. 10 is a schematic circuit diagram of a pixel of the OLED display according to the fourth exemplary embodiment of the present invention.

Figure 10:
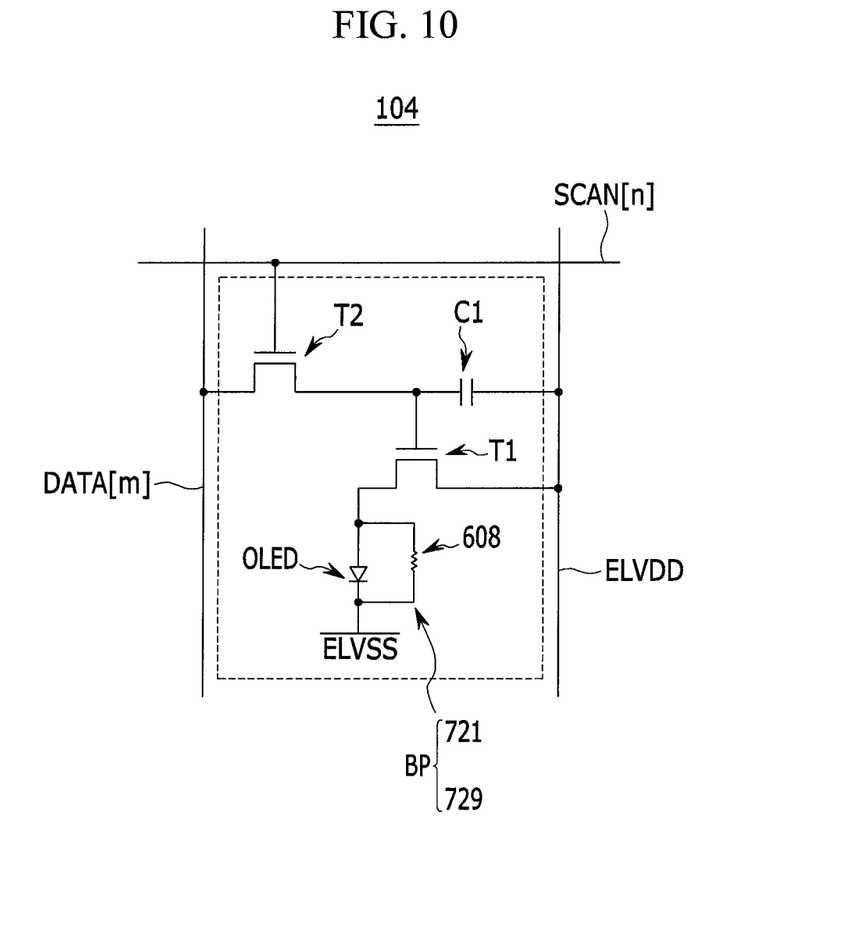
FIG. 10 is a schematic circuit diagram of a pixel of the organic light emitting diode display according to the fourth exemplary embodiment of the present invention.

As shown in FIG. 9 and FIG. 10, an OLED display 104 according to the fourth exemplary embodiment of the present invention includes a driving thin film transistor T1, a switching thin film transistor T2, a capacitor C1, a scan wire SCAN [n], a data wire DATA[m], a first power wire ELVDD, a second power wire ELVSS, and an organic light emitting element OLED; and they are formed in each pixel.

In addition, in the fourth exemplary embodiment of the present invention, the OLED display 104 includes a resistor 608 of which a first end is connected to an anode 710 of the organic light emitting element OLED. A second end of the resistor 608 is connected with a bypass wire BP. In addition, in the fourth exemplary embodiment, the bypass wire BP includes a hole traveling layer 721 and an electron traveling layer 729, and is connected with a cathode 730 of the OLED. That is, the first end of the resistor 608 is connected with the anode 710 and the second end thereof is connected with the cathode 730.

The organic light emitting element OLED includes the anode 710 for injecting holes, the cathode 730 for injecting electrons and extended throughout the organic light emitting element OLED, and an organic emission layer 720 provided between the anode 710 and the cathode 730. The organic emission layer 720 includes a hole traveling layer 721, a main emission layer 725, and an electron traveling layer 729. The hole traveling layer 721 includes a hole injection layer (HIL) and a hole transport layer (HTL), and is a channel through which the holes injected from the anode 710 travel. The electron traveling layer 729 includes an electron injection layer (EIL) and an electron transport layer (ETL), and is a channel through which the electrons injected from the cathode 730 travel. The holes and electrons respectively injected from the anode 710 and the cathode 730 are combined in the main emission layer 725 such that light emission is carried out in the main emission layer 725. The main emission layer 725 is disposed in a location corresponding to the anode 710, and the hole traveling layer 721 and the electron traveling layer 729 are extended throughout the organic emission layer corresponding to the cathode 730.

In the fourth exemplary embodiment of the present invention, the first end of the resistor 608 is directly connected with the anode 710 of the organic light emitting element OLED, and the second end of the resistor 608 is connected with the hole traveling layer 721 and the electron traveling layer 729, which are the bypass wire BP.

The resistor 608 is layered on the anode 710, and may be formed of a material that is the same as or different from a material of the anode 710.

The hole traveling layer 721 and the electron traveling layer 729 of the bypass wire BP are connected with the resistor 608 through different openings formed in a pixel defining layer 190 to expose the resistor 608, and the hole traveling layer 721 is directly connected with the resistor 608.

In the OLED display 104 according to the fourth exemplary embodiment of the present invention, a driving current passed through the driving thin film transistor T1 is divided into the resistor 608 and the organic light emitting element OLED. The resistance of the organic light emitting element OLED varies according to emission luminance, and the resistance is decreased as the luminance is increased.

Accordingly, the current flowing to the resistor 608 is changed according to the emission luminance of the organic light emitting element OLED.

In further detail, while the driving thin film transistor T1 is in the turn-off state, a leakage current flowing in the driving thin film transistor T1 partially flows to the cathode 730 through the resistor 608 and the bypass wire BP.

Thus, a deterioration degree of a contrast ratio of the OLED display 104 due to light emission of the organic light emitting element OLED in a black mode by the leakage current can be decreased.

Hereinafter, operation of the OLED display according to the fourth exemplary embodiment of the present invention will be described in further detail with reference to FIG. 10.

First, the switching thin film transistor T2 is turned on according to a scan signal transmitted through the scan wire SCAN[n]. While the switching thin film transistor T2 is in the turn-on state, a data voltage transmitted through the data wire DATA[m] is transmitted to a gate electrode of the driving thin film transistor T1, a voltage of the first power wire ELVDD is supplied to a source electrode of the driving thin film transistor T1, and a driving current according to a gate-source voltage difference flows to the driving thin film transistor T1. The driving current is transmitted to the anode of the organic light emitting element OLED.

When the driving thin film transistor T1 is operated according to a data voltage of low luminance, the resistance of the organic light emitting element OLED is significantly high compared to that of high luminance. Thus, a portion of the driving current flowing to the resistor 608 is increased compared to the case of high luminance.

That is, in a luminance area where resistance of the organic light emitting element OLED is higher than resistance of the resistor 608, more driving current flows to the resistor 608.

When the resistor 608 is connected to the organic light emitting element OLED, more current should flow than a case when no resistor 608 is used. The increased degree of the driving current is relatively larger in the low luminance region. Then, a ratio of a current dispersion with respect to a target luminance in a low luminance area can be decreased. In further detail, since the organic light emitting element OLED emits light of luminance with a small driving current, when a variation occurs between driving currents due to characteristic differences of the driving thin film transistors, substantial luminance variation may be recognized. However, when a resistor is used, the driving current for light emission of the organic light emitting element (OLED) with the corresponding low luminance is increased so that a ratio between the driving current variation and the driving current is decreased.

Accordingly, for the same luminance of the case that no resistor is provided, the amount of current flowing to the driving thin film transistor is increased to reduce the ratio of current dispersion with respect to the target current, and mura can be increased.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

| <Description of Some References> |
|---|
| 101: organic light emitting diode (OLED) display |
| 138, 178, 608: resistor |
| 157, BP: bypass wire        176: connection member |
| 710: anode                  720: organic emission layer |
| 730: cathode |
| C1, C2: capacitor |
| DATA[m]: data wire |
| ELVDD: first power wire |
| ELVSS: second power wire |

| <Description of Some References> |
|---|
| OLED: organic light emitting element |
| SCAN[n]: scan wire |
| T1: driving thin film transistor |
| T2: switching thin film transistor |
| Vint: initializing voltage wire |

What is claimed is:

1. An organic light emitting diode (OLED) display comprising:
   a switching transistor configured to perform a switching operation according to a scan signal;
   a driving transistor configured to supply a driving current according to a data signal transmitted according to the switching operation of the switching transistor;
   an organic light emitting element electrically connected with the driving transistor and configured to emit light according to the driving current;
   a resistor having a first end connected with an anode of the organic light emitting element; and
   a bypass wire connected with a second end of the resistor, wherein the bypass wire comprises an initializing voltage wire configured to initialize the driving transistor.

2. The OLED display of claim 1, wherein the resistor is formed in the same layer where a semiconductor layer of at least one of the switching transistor or the driving transistor is formed.

3. The OLED display of claim 2, further comprising a connection member connecting the anode of the organic light emitting element and the first end of the resistor.

4. The OLED display of claim 3, wherein the connection member is formed in the same layer where a source electrode and a drain electrode of at least one of the switching transistor or the driving transistor are formed.

5. The OLED display of claim 1, wherein the initializing voltage wire is formed in the same layer where a gate electrode of at least one of the switching transistor or the driving transistor is formed.

6. The OLED display of claim 1, further comprising a first power wire connected with the source electrode of the driving transistor and a second power wire connected with a second electrode of the organic light emitting element.

7. The OLED display of claim 6, wherein the bypass wire is formed on the same layer where a gate electrode of at least one of the switching transistor or the driving transistor is formed.

8. The OLED display of claim 7, further comprising a scan wire configured to supply the scan signal,
   wherein the bypass wire and the scan wire are formed substantially in parallel with each other in the same layer.

9. The OLED display of claim 1, wherein the organic light emitting element comprises:
   an organic emission layer on the anode; and
   a cathode on the organic emission layer.

10. The OLED display of claim 9, wherein the organic emission layer comprises:
    a main emission layer corresponding to the anode and configured to emit light;
    a hole traveling layer between the main emission layer and the anode, and corresponding to the cathode; and an electron traveling layer disposed between the main emission layer and the cathode, and corresponding to the cathode.

\* \* \* \* \*